(12) United States Patent
Manring et al.

(10) Patent No.: US 7,248,041 B2
(45) Date of Patent: Jul. 24, 2007

(54) DEVICE AND METHOD FOR MEASURING TRANSIENT MAGNETIC PERFORMANCE

(75) Inventors: Edward B. Manring, Columbus, IN (US); David M. Rix, Columbus, IN (US); Donald J. Benson, Columbus, IN (US)

(73) Assignee: Cummins, Inc., Columbus, IN (US)

( * ) Notice: Subject to any disclaimer, the term of this patent is extended or adjusted under 35 U.S.C. 154(b) by 233 days.

(21) Appl. No.: 10/628,606

(22) Filed: Jul. 28, 2003

(65) Prior Publication Data

US 2005/0024048 A1 Feb. 3, 2005

(51) Int. Cl.
*G01N 27/72* (2006.01)
*G01R 33/12* (2006.01)

(52) U.S. Cl. ..................... 324/228; 324/234

(58) Field of Classification Search .............. 324/202, 324/239, 240, 241, 242, 243, 228, 234, 238
See application file for complete search history.

(56) References Cited

U.S. PATENT DOCUMENTS

| | | | |
|---|---|---|---|
| 4,274,052 A | 6/1981 | Gentry, Jr. et al. | |
| 4,475,083 A * | 10/1984 | Linder | 324/227 |
| 4,804,912 A * | 2/1989 | Lysen | 324/207.17 |
| 4,922,197 A * | 5/1990 | Juds et al. | 324/207.21 |
| 5,015,951 A | 5/1991 | Melcher | |
| 5,394,084 A * | 2/1995 | Snyder | 324/225 |
| 5,528,142 A | 6/1996 | Feickert | |
| 5,537,038 A | 7/1996 | Ando | |
| 5,541,777 A * | 7/1996 | Sakamoto et al. | 359/824 |
| 5,600,237 A * | 2/1997 | Nippert | 324/207.16 |
| 5,729,134 A * | 3/1998 | Lavan et al. | 324/239 |
| 5,764,052 A | 6/1998 | Renger | |
| 6,114,849 A | 9/2000 | Price et al. | |
| RE36,986 E | 12/2000 | Melcher | |
| 6,239,596 B1 | 5/2001 | Stupak, Jr. et al. | |
| 6,314,473 B1 * | 11/2001 | Singer et al. | 710/5 |
| 6,657,847 B1 * | 12/2003 | Wright et al. | 361/160 |
| 2002/0084777 A1 * | 7/2002 | Rossi et al. | 324/145 |
| 2002/0163330 A1 * | 11/2002 | Sekiya | 324/207.17 |
| 2002/0179830 A1 * | 12/2002 | Pearson et al. | 250/250 |
| 2004/0152261 A1 * | 8/2004 | Spencer et al. | 438/257 |

FOREIGN PATENT DOCUMENTS

WO          WO 2097424 A2 * 12/2002

* cited by examiner

*Primary Examiner*—Edward Lefkowitz
*Assistant Examiner*—David M Schindler
(74) *Attorney, Agent, or Firm*—Barnes & Thornburg LLP (57) ABSTRACT

A device for evaluating magnetic component performance and methods of evaluating transient magnetic performance of such components are disclosed. Magnetic flux capacity and/or energy loss of a magnetic component is/are measured, and the measurement data is electronically processed to evaluate the magnetic performance of the component.

21 Claims, 10 Drawing Sheets

DEVICE AND METHOD FOR MEASURING TRANSIENT MAGNETIC PERFORMANCE

FIELD OF THE DISCLOSURE

This disclosure relates generally to a device for evaluating magnetic component performance and methods of evaluating transient magnetic performance of such components. More particularly, this disclosure relates to equipment and a method of measuring magnetic flux capacity and energy loss of a magnetic component.

BACKGROUND AND SUMMARY OF THE DISCLOSURE

Actuators, motors, sensors and other electromechanical devices and transducers use magnetic components or components subjected to a magnetic field to convert electrical energy into mechanical motion or mechanical motion into electrical energy. Often the performance of such devices is dependent upon the capacity of a component, hereinafter referred to as a magnetic component, to conduct magnetic flux and the energy losses incurred in exciting the magnetic component to a given flux value at a certain rate. Measurement equipment and methods are known for measuring the capacity of a magnetic component to conduct magnetic flux. Similarly, measuring equipment and gauges are known for measuring the energy losses incurred in exciting a magnetic component to a given flux value. Measurement of the performance of such components is valuable as a quality control measure at the time of manufacturing such components and for subsequent diagnostic testing.

The disclosed device includes a flux path closure device for electrically coupling to a magnetic component to form a closed magnetic flux path and a coil for inducing a magnetic flux in the magnetic component through the closed magnetic flux path. The flux path closure device may be formed of a material that reduces energy losses to the flux path closure device by suppressing eddy currents within the flux path closure device. To suppress eddy currents within the flux path closure device, the flux path closure device may be fabricated from laminates. Alternatively, the flux path closure device may be fabricated from insulated powder in order to suppress eddy currents. Oxide-coated pressed metal particles may also be used to fabricate path closure device. Spacers may be disposed between flux path closure device and magnetic component. An appropriate spacer may be fabricated from non-magnetic material. An appropriate spacer may be fabricated from non-conductive material. Appropriate materials from which spacers may be fabricated include paper, glass, ceramics and other non-magnetic and non-conductive materials.

In the disclosed device, an excitation coil is attached to flux path closure device. Excitation leads electrically coupled to the excitation coil and a signal source provide an excitation signal to the excitation coil. The signal source generates a transient signal so that excitation coil generates a transient magnetic flux. The signal source may generate a transient current signal of a specified shape that is applied to the coil to generate a transient magnetic flux through the magnetic component and the flux path closure device. The signal source may alternatively generate a transient voltage signal of a specified shape that is applied across the terminals of the excitation coil to generate a transient magnetic flux through the magnetic component and the flux path closure device. A monitoring device is coupled to the excitation coil to monitor voltage across the coil terminals and current through the excitation coil. The monitoring device is configured to calculate an effective resistance of the excitation coil from voltage and current data inputs and to calculate the flux using voltage and current data and the calculated effective resistance. The monitoring device may include a graph generating device for generating flux vs. time graphs, current vs. time graphs, voltage vs. time graphs, flux linkage vs. time graphs and/or flux linkage vs. current graphs.

The disclosed method of evaluating the magnetic performance of a magnetic component includes coupling a flux path closure device to the magnetic component to form a closed magnetic flux path through the flux path closure device and the magnetic component, energizing an excitation coil by forming a voltage potential difference across terminals of the coil and passing current through the coil to generate a magnetic flux in the closed magnetic flux path, obtaining voltage data indicating the voltage potential across the terminals of the coil and current data indicating the current through the coil, calculating an effective resistance of the coil using the voltage data and the current data, calculating the flux using the calculated effective resistance and using the calculated flux to determine the flux capacity of and energy losses experience by the magnetic component. The method may include the step of graphing the flux over time. The energizing step may be accomplished by generating a transient current signal through the coil. The energizing step may be accomplished by generating a transient voltage signal applied across terminals of the coil.

These and other objects of the present invention will become more apparent from the following description of the illustrative embodiments.

DESCRIPTION OF THE ILLUSTRATIVE EMBODIMENTS

For the purposes of promoting an understanding of the principles of the invention, reference will now be made to a number of illustrative embodiments shown in the drawings and specific language will be used to describe the same. It will nevertheless be understood that no limitation of the scope of the invention is thereby intended.

To evaluate the performance of a magnetic component 22, 222 it is necessary to measure the capacity of the magnetic component 22, 222 to conduct flux and to measure the energy loss associated with exciting the magnetic component 22, 222 to a given flux value at a certain rate. The disclosed device 20, 120, 220, 320 and method obtains a qualitative evaluation of flux rise and energy loss in a magnetic component 22, 222 with a single measurement. While several embodiments of device 20, 120, 220, 320 and magnetic component 22, 222 are illustrated, most features are virtually identical or very similar in the various embodiments. Therefore, identical or similar reference numerals are used in identifying the features of the various devices and magnetic components. Unless specifically stated otherwise, device 20 and magnetic component 22 will now be described with the understanding that the description, where applicable, applies to device 120, 220, 320 and magnetic component 222.

Device 20 provides closure of a magnetic flux path 23 through the magnetic component 22 and an excitation coil 26 to excite flux in the closed flux path 23. Device 20 for evaluating the magnetic performance of a magnetic component 22, in accordance with the present disclosure, includes a flux path closure device 24, an excitation coil 26, a signal source 28 and a monitoring device 30. While disclosed only with reference to device 120, 220 and 320, device 20 may also include a separate monitoring coil 80 within the teaching of this disclosure. Likewise, while disclosed only with reference to device 220, device 20, 120, 320 may include a spacer 50 within the scope of this disclosure. Device 20 may be used for bench testing magnetic components 22 for quality control purposes after manufacturing or for testing suspect magnetic components 22 when less than optimal performance is exhibited by the device into which they are incorporated.

Figure 2:
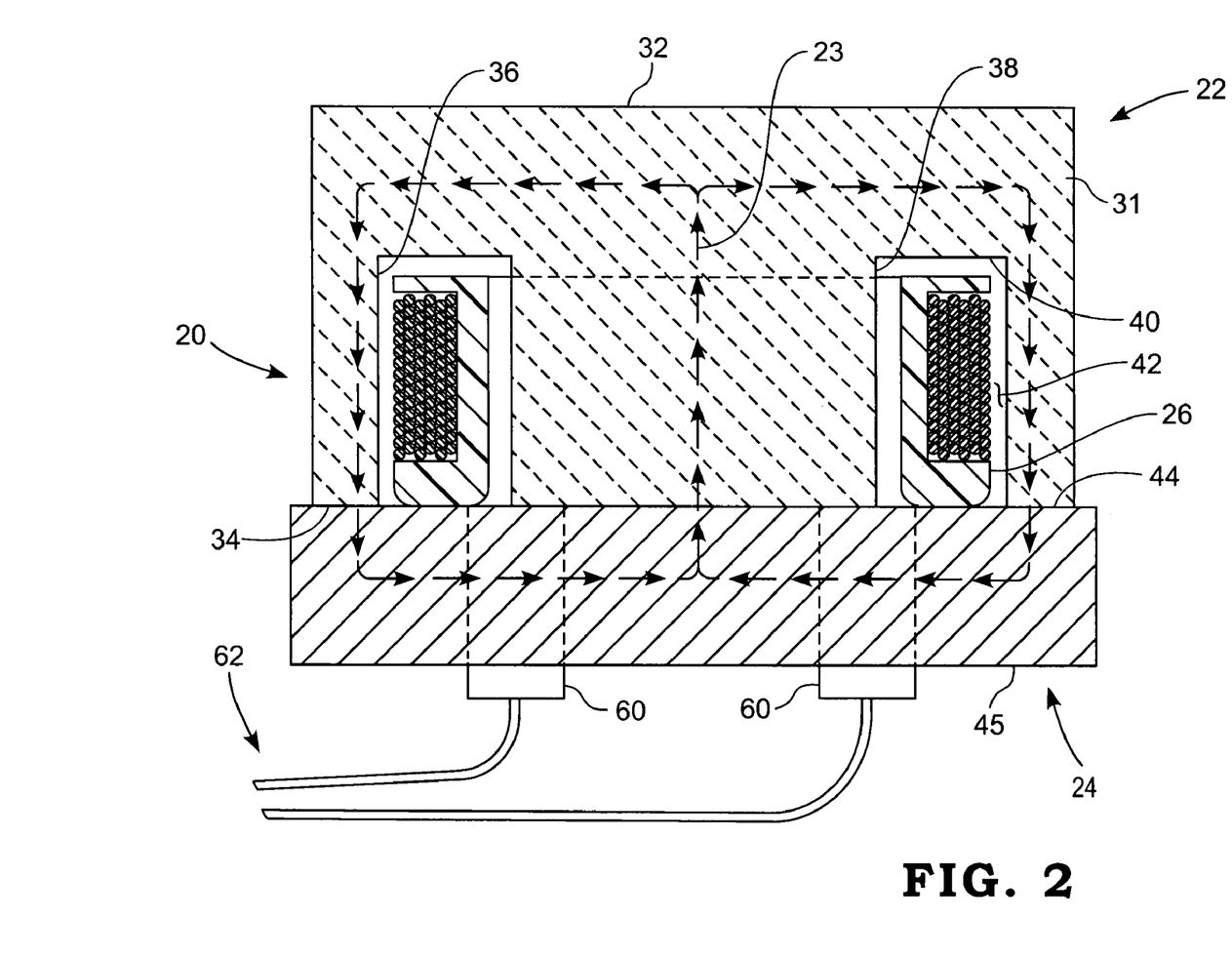
FIG. 2 is a cross-sectional view of one embodiment of the magnetic component, flux path closure device, excitation coil and excitation signal leads of the device of FIG. 1.
Figure 3:
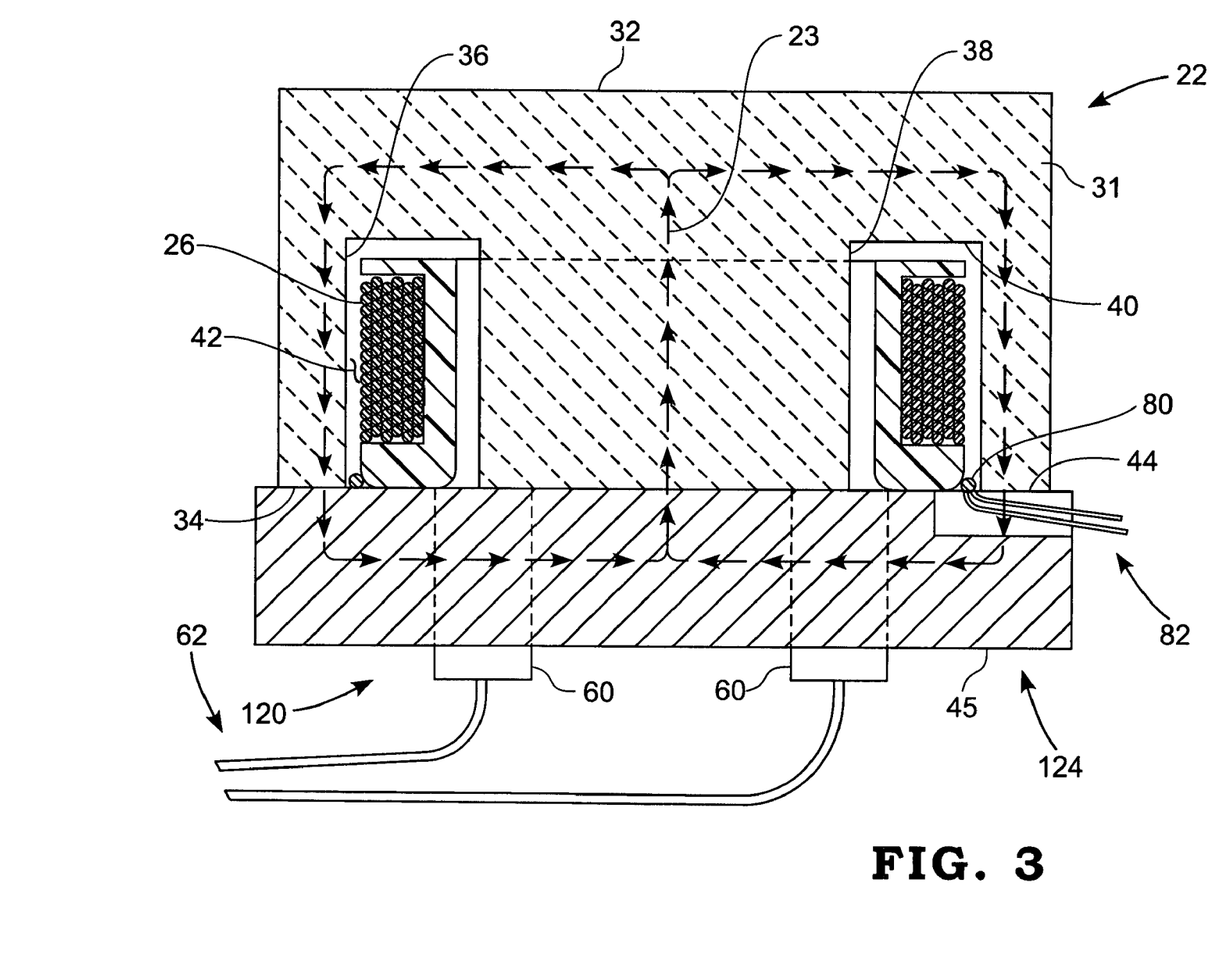
FIG. 3 is a cross-sectional view of another embodiment of the magnetic component, flux path closure device, excitation coil and excitation signal leads of the device of FIG. 1 which also includes a separate coil for directly monitoring flux and separate leads for the separate coil.
Figure 4:
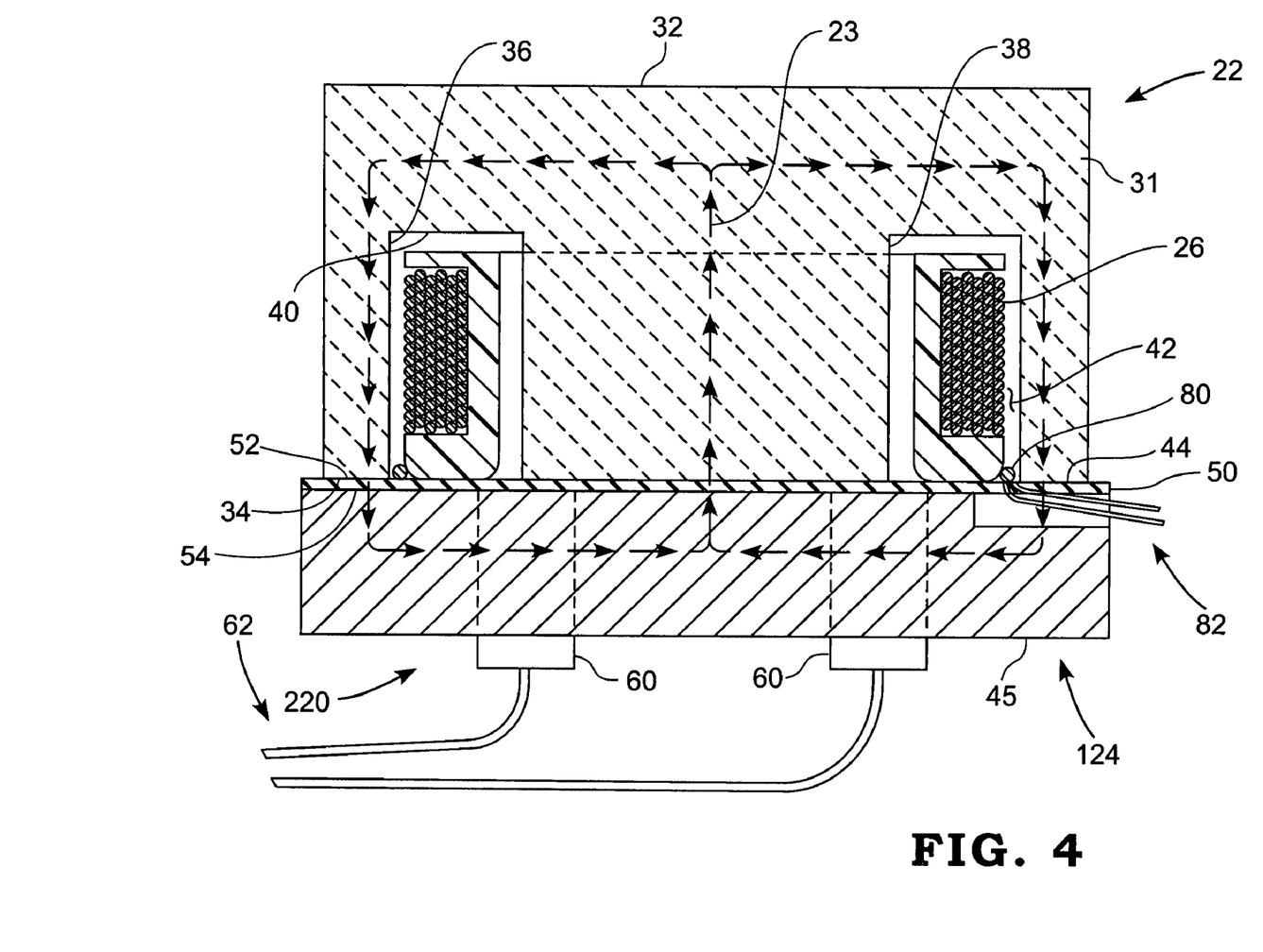
FIG. 4 is a cross-sectional view of yet another embodiment of the magnetic component, flux path closure device, excitation coil and excitation signal leads of the device of FIG. 1 which also includes a separate coil for directly monitoring flux, separate leads for the separate coil and a spacer interposed between the magnetic component and flux path closure device.

Referring to FIGS. 2–4, illustrated magnetic component 22 is a stator core of a fuel injector actuator. As such, illustrated magnetic component 22 includes a cylindrical core body 31 having top surface 32, a bottom surface or mating surface 34, an outside cavity wall 36, an inside cavity wall 38 and a cavity floor 40. Outside cavity wall 36, inside cavity wall 38 and cavity floor 40 define an annular cavity 42 extending axially inwardly from bottom surface 34 of magnetic component 22. Annular cavity 42 is sized to receive excitation coil 26 therein. In illustrated magnetic component 22, bottom or mating surface 34 is substantially planar but may include minor surface imperfections.

Referring to generally to FIGS. 1–5 and specifically to FIG. 2, the illustrated device 20 includes a flux path closure device 24 and an excitation coil 26 configured to excite a flux through a flux path 23 extending through magnetic component 22 and flux path closure device 24. Illustrated flux path closure device 24 is disk shaped having a substantially planar upper surface or mating surface 44 which may contain minor surface imperfections or irregularities. Upper or mating surface 44 of flux path closure device 24 is configured to conform to bottom or mating surface 34 of magnetic component 22. In the first illustrated embodiment, upper surface 44 of flux path closure device 24 and bottom surface 34 of magnetic component 22 contiguously engage one another along the boundary formed between mating surfaces 34, 44 to form a flux path 23 through magnetic component 22 and flux path closure device 24.

The illustrated flux path closure device 24 is manufactured to suppress eddy currents therein. In a conductor there are a multitude of arbitrary closed paths that may act as conduction routes for current flow. Any conductor subjected to a time varying magnetic flux, according to Faraday's law, will have an e.m.f. induced therein. These currents induced in arbitrary closed paths within a conductor by a time varying magnetic flux are known as eddy currents. Because of the ohmic resistance of the conductor, eddy currents result in an energy loss through heat dissipation. To ensure that energy losses measured by the disclosed device and method are attributable to the magnetic component 22 being evaluated, it is preferable to reduce the energy losses attributable to eddy currents in the flux path closure device 24.

The illustrated flux path closure device 24 is fabricated from oxide-coated pressed metal particles. Oxide-coated pressed metal particles exhibit an electrical conductivity that is lower than other metal powders as the oxide-coating acts as an insulator. The illustrated flux path closure device 24 is fabricated from high purity grade insulated metal powders. A suitable high purity grade insulated metal powder is available as soft magnetic materials from Mii Technologies, LLC, West Lebanon, N.H. as stock no. SM-2 HB. Mii Technologies applies insulating inorganic coatings to pure iron particles. Precise control of coating thickness yields soft magnetic materials with predictable, low core losses. These materials make it possible to design electromagnetic devices with highly desirable properties, such as high efficiency three-dimensional flux path devices. Excellent high frequency behavior of soft magnetic materials reduces energy losses caused by higher harmonics of the driving frequencies and by switching transients. Components fabricated with Mii particle coating technology exhibit good strength even at elevated temperatures for applications in hot environments, such as engine compartments, without loss of mechanical strength or danger of 'creep'. Such compounds are immune to degradation by Diesel fuel or alcohol. The indicated SM-2 HB alloy exhibits a maximum relative permeability of approximately 610.

Mu Technologies, LLC also produces other insulated metal powders from which flux path closure device may be fabricated. Insulated metal powders from which flux path closure device 24 may be fabricated are also available from HÖGANÄS AB, Sweden, such as a soft magnetic composite "SMC" (an iron powder encapsulated in an insulating material) under the trade name SOMALOY™ 500 soft magnetic composite or SOMALOY™ 550 soft magnetic composite. Suppression of eddy currents can also be achieved using other known techniques such as by fabricating the flux path closure device 24 from laminated layers of iron. Flux path closure device 24 may be fabricated from other materials within the scope of the disclosure.

While the above description refers only to flux path closure device 24, such description is equally applicable to flux path closure devices 124, 224 in devices 120, 220, 320 except that in device 220, a spacer 50 separates flux path closure device 124 from magnetic component 22 so that mating surfaces 34, 44 do not contiguously engage one another but rather contiguously engage surfaces of the spacer.

Referring to FIG. 4, spacer 50 is located between flux path closure device 124 and magnetic component 22. Illustrated spacer 50 is disk-shaped and has a substantially uniform thickness between top surface 52 and bottom surface 54. Spacer 50 has a substantially planar top surface 52 configured to contiguously engage bottom surface 34 of magnetic component 22 and a substantially planar bottom surface 54 configured to contiguously engage top surface 44 of flux path closure device 124. Those skilled in the art will recognize that a spacer 50 may be interposed between any of the other disclosed magnetic components 22, 222 and flux path closure devices 24, 224 within the scope of the disclosure. Thus, in alternative embodiments of device 20, a closed flux path is formed through magnetic component 22, spacer 50 and flux path closure device 24, 124, 224. Spacer 50 is provided to minimize any error which may arise because of irregularities in the bottom surface 34 of magnetic component 22 or the top surface 44 of flux path closure device 124.

The magnetic permeability of a total flux path 23 is a function of the magnetic permeability of the various components along the flux path 23. Flux path closure device 124 has a specific magnetic permeability as does magnetic component 22. Air also has a magnetic permeability. If there are surface irregularities in mating surfaces 34, 44, respectively, of magnetic component 22 or flux path closure device 124, an air gap is formed between the components. Due to mating surface irregularities, the width of the air gap will vary across the interface. By placing a spacer 50 with a known magnetic permeability between the mating surfaces 34, 44, respectively, of magnetic component 22 and flux path closure device 24, a larger gap is formed in flux path 23. This larger gap is comprised of air gaps between spacer 50 and mating surfaces 34, 44, respectively, of magnetic component 22 and flux path closure device 124 and the thickness of spacer 50. The magnetic permeability of the entire flux path 23 becomes more predictable as the ratio of the gap resulting from mating surface imperfections and the total gap width becomes less. Thus, insertion of spacer 50 between magnetic component 22 and flux path closure device 124 lessens the effects on flux measurements that might result from surface imperfections of the magnetic component 22 or flux path closure device 124.

Illustratively, spacer 50 is non-magnetic and electrically non-conductive. Effective spacers 50 include a paper sheet or a glass or ceramic sheet of uniform thickness. In the illustrated embodiment, spacer 50 is attached to flux path closure device 124 by gluing bottom surface 54 of spacer 50 to top surface 44 of flux path closure device 24.

As shown, for example, in FIGS. 2–4, excitation coil 26 is configured to be received in cavity 42 of magnetic component 22. In an alternative embodiment of device 320, flux path closure device 224 is formed to include an annular cavity 242 and excitation coil 26 is configured to be received in annular cavity 242 of flux path closure device 224, as shown, for example, in FIG. 5. In the illustrated embodiments, excitation coil 26 includes N number of turns, illustratively depicted as eighty-four turns. Those skilled in the art will recognize that excitation coil 26 may include an arbitrary number of turns and that the number of turns in any implementation of coil 26 will be known.

Ends of excitation coil 26 constitute terminals (60) to which excitation leads 62 are coupled. In the illustrated embodiment, excitation leads 62 are wires extending between terminals (60) of excitation coil 26 and excitation signal supply 28. Excitation wires 62 extend through flux path closure device 24 between top surface 44 and bottom surface 45. Illustratively, excitation coil 26 is attached to flux path closure device 24, or to spacer 50 attached to flux path closure device 124, by gluing. Other means of attachment of excitation coil 26 to flux path closure device 24 or spacer 50 are within the scope of the disclosure.

Figure 5:
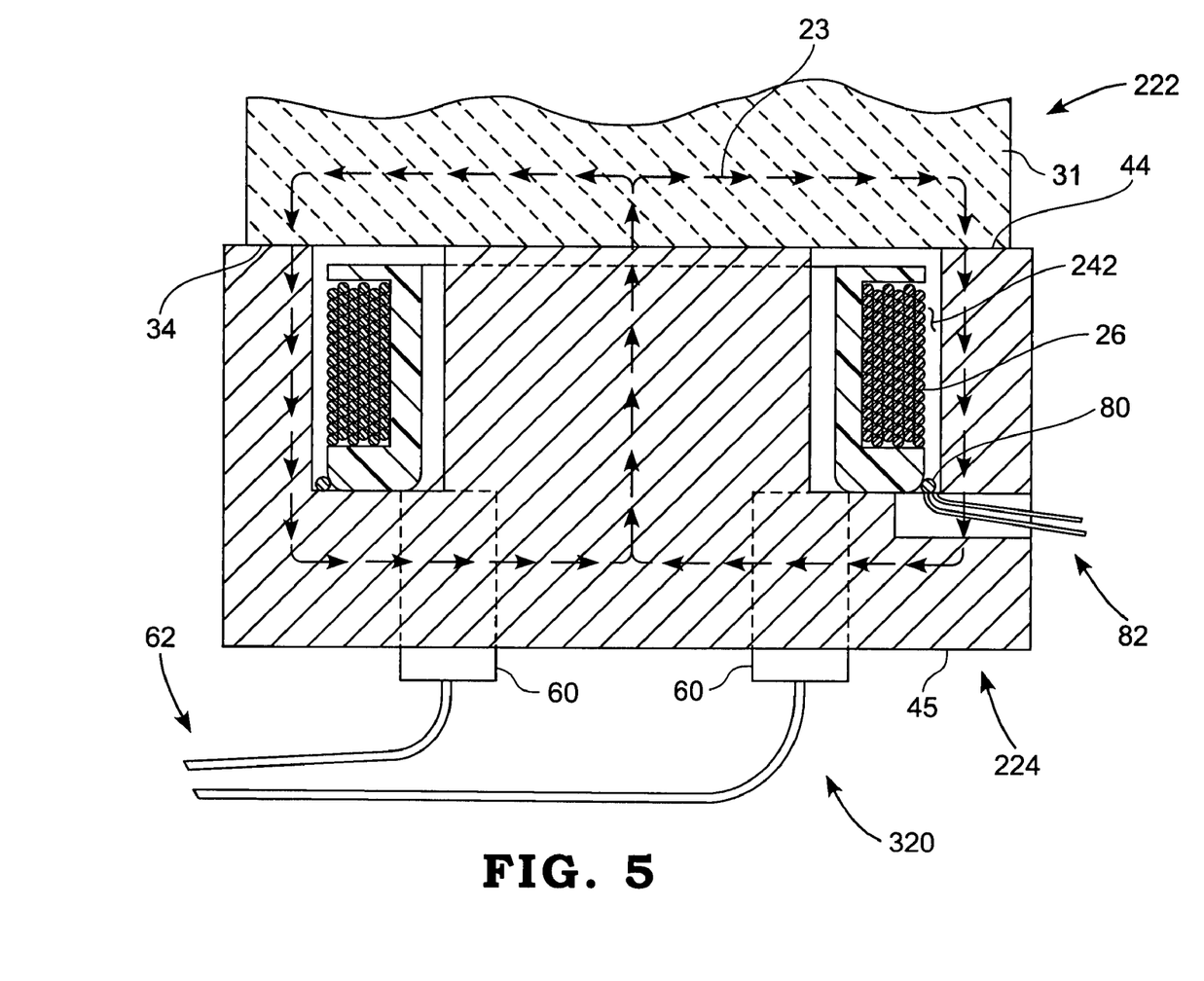
FIG. 5 is a cross-sectional view of still another embodiment of the magnetic component, flux path closure device, excitation coil and excitation signal leads of the device of FIG. 1 which also includes a separate coil for directly monitoring flux and separate leads for the separate coil.

While having been described as being configured to be received within a cavity 42 in magnetic component 22, it is within the scope of the disclosure for excitation coil 26 to be received in a cavity 242 of flux path closure device 224, as shown, for example, in FIG. 5. In fact, excitation coil 26 need not be received within a cavity within the scope of the disclosure, it being sufficient that excitation coil 26 be magnetically coupled to the closed flux path 23 formed through the flux path closure device 24 and magnetic component 22 so that upon excitation, excitation coil 26 generates a magnetic flux through the closed flux path 23.

Figure 1:
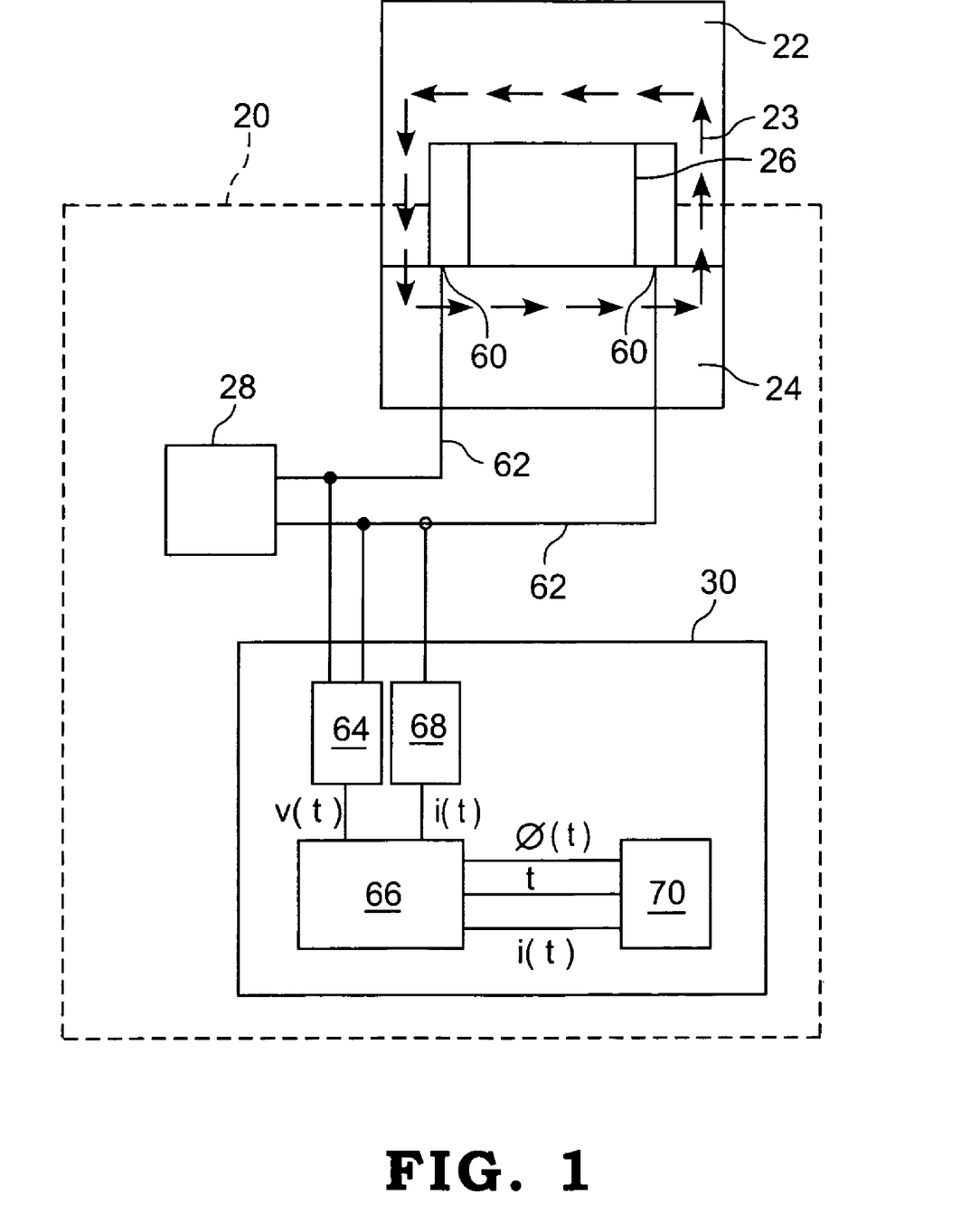
FIG. 1 is a diagrammatic view of a device for measuring magnetic performance of a magnetic component showing a magnetic component and a flux path closure device arranged to form a closed flux path through the magnetic component and flux path closure device, an excitation coil for generating a flux through the closed flux path upon receipt of an excitation signal from a signal source, and a monitoring device monitoring the current through the excitation coil and voltage across the terminals of the excitation coil to generate signals indicative of the current, time and flux.

In the illustrated embodiment, signal source 28 includes a current source capable of generating a known transient current signal that passes through excitation wires 62 to excite excitation coil 26. Monitoring system 30 includes a sensor 64 for sensing the voltage across the terminals of excitation coil 26. Monitoring system also includes a processor 66 interfacing with sensor 64 to receive and record voltage and current data. Processor 66 is configured to compute an effective resistance for excitation coil 26 based on the received current and voltage data. In one embodiment of monitoring system 30 conducive to bench testing of parts, monitoring system 30 includes a digital volt meter acting as sensor 64 to read the voltage across terminals of excitation coil 26. The digital volt meter may be configured to sample voltage and supply voltage data at intervals or may continuously sample the voltage across the terminals. Monitoring system 30 also includes a digital current meter acting as sensor 68 for sensing the current through excitation coil 26 to provide current data. Thus, digital current meter acts as part of the interface between processor 66 and signal source 28. Those skilled in the art will recognize that a digital multi-meter may be configured for use as sensors 64 and 68.

Based upon the voltage data and current data, processor 66 is appropriately programmed to calculate an effective resistance for excitation coil 26. Processor 66 is also appropriately programmed to calculate the flux through flux path 23 based upon the voltage data, current data, effective resistance and number of turns in excitation coil. In the illustrated embodiment, processor interfaces with a graphing system 70 configured to generate flux vs. time 72, current vs. time 74, voltage vs. time 76 and flux vs. current 78 graphs. While the term flux is used herein when describing the calculated flux in the closed flux path, FIGS. 7–9 actually depict the flux linkage vs. time and flux linkage vs. current graphs. Those skilled in the art will recognize that flux linkage is simply the product of the flux and the number of turns in a given coil.

In a monitoring system 30 suitable for bench testing of magnetic component 22, processor 66 is resident on a laptop computer running Microsoft Excel software configured to read current data from sensor 68 and voltage data from sensor 64 during appropriate clock cycles and compute the effective resistance of excitation coil 26 by integrating (actually summing at a high sample rate) the current data and voltage data and dividing the integrated voltage data by the integrated current data. Processor 66 is programmed to calculate the effective resistance of excitation coil 26 during the transient current signal and store the effective resistance calculated. Processor 66 is programmed to calculate the flux by integrating (actually summing at a high sample rate) the quotient of the dividend represented by the difference of the voltage minus the product of the current times the effective resistance divided by the divisor represented by the number of turns of excitation coil 26 during the transient current signal. Monitoring system 30 utilizes the graphing capabilities of Excel to generate flux vs. time 72, current vs. time 74, voltage vs. time 76 and flux vs. current 78 graphs. Should the user desire to simplify the programming of processor 66, the graph of flux linkage vs. time 72 and flux linkage vs. current 78 can be used eliminating the need of dividing by the number of turns in the coil. Hereinafter, since they are simply scalars of each other, the term flux will be used to include flux linkage where appropriate. Other monitoring systems 30 may be used within the scope of the disclosure, including, but not limited to, a programmable graphing oscilloscope.

Figure 6:
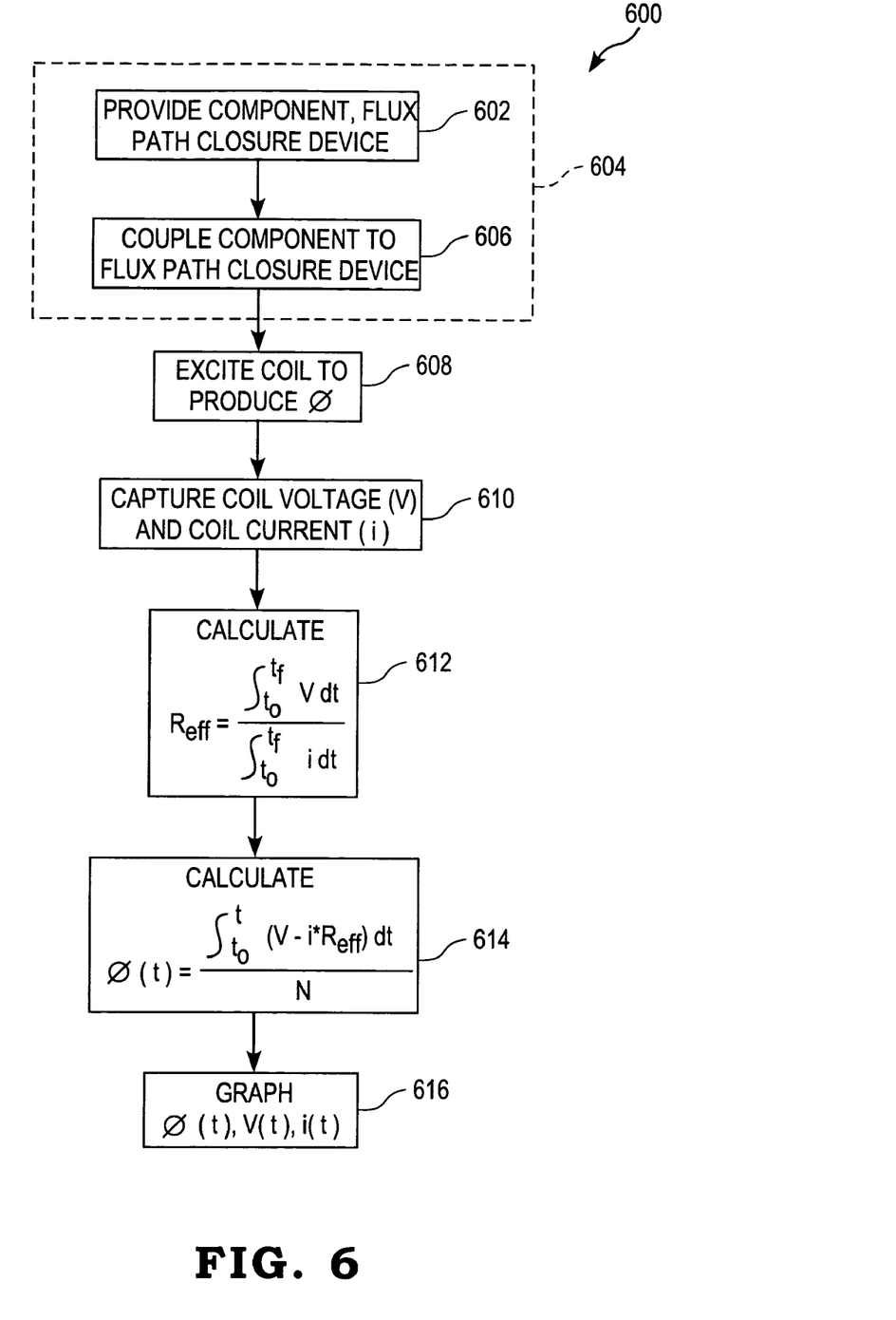
FIG. 6 is a flow chart representing a method of monitoring the transient performance of a magnetic component.

In accordance with one illustrative method of evaluating magnetic performance 600 of a magnetic component, as shown in FIG. 6, a closed flux path 23 is created 604 through the flux path closure device 24 and the magnetic component 22 by coupling the provided closure device and component 606. A transient signal is generated by signal source 28 to excite 608 a coil 26 to generate magnetic flux in the closed flux path 23. The current through the coil 26 and the voltage across the coil terminals (60) are measured 610 during the duration of the transient signal. An effective resistance for the coil 26 is calculated 612 based upon the current and voltage measurements taken during the transient signal. The transient signal also generates magnetic flux through the closed flux path 23. The current through the coil 23 and the voltage across the coil terminals (60) is measured during the duration of the transient signal. Flux is calculated 614 at a number of points throughout the transient event using the measured current and voltage data and the calculated effective resistance. Plots of flux versus time during the transient signal and a hysteresis curve of flux vs. current are generated 616 and analyzed to evaluate the magnetic performance of the magnetic component.

Figure 7:
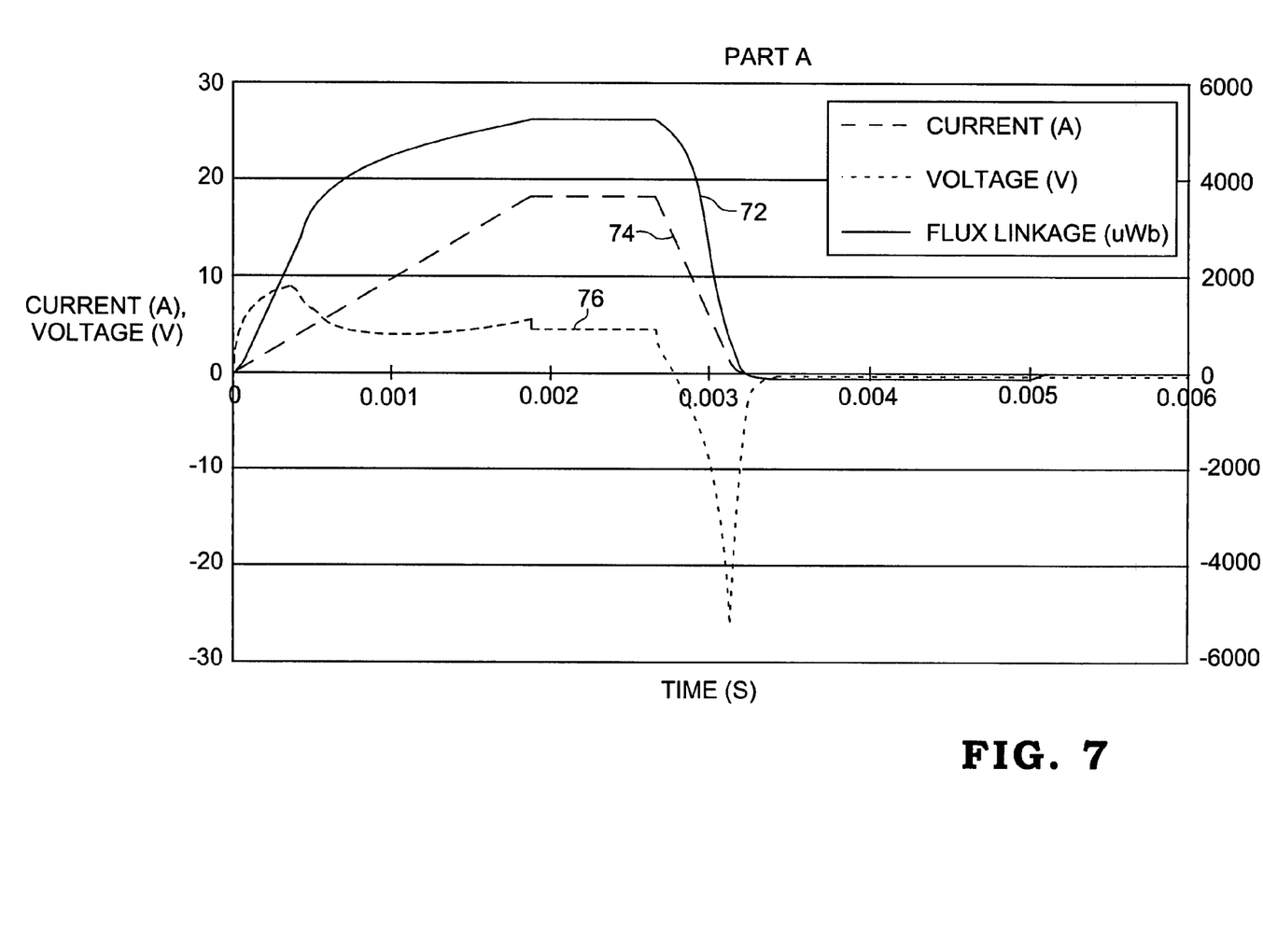
FIG. 7 is a combination graph showing current, voltage and flux linkage vs. time of a first magnetic component evaluated with the disclosed method using the disclosed device.
Figure 8:
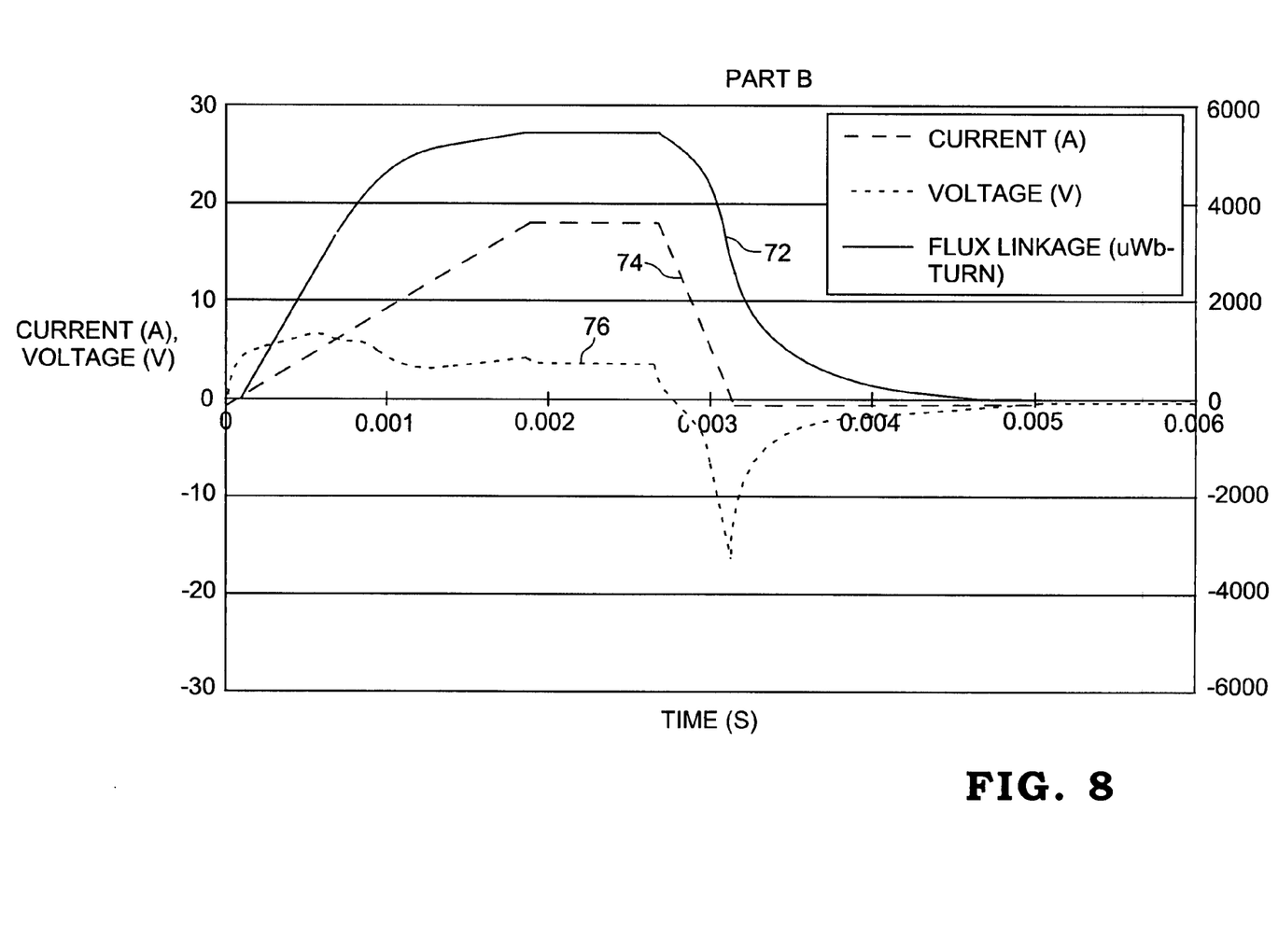
FIG. 8 is a combination graph showing current, voltage and flux linkage vs. time of a second magnetic component evaluated with the disclosed method using the disclosed device.
Figure 9:
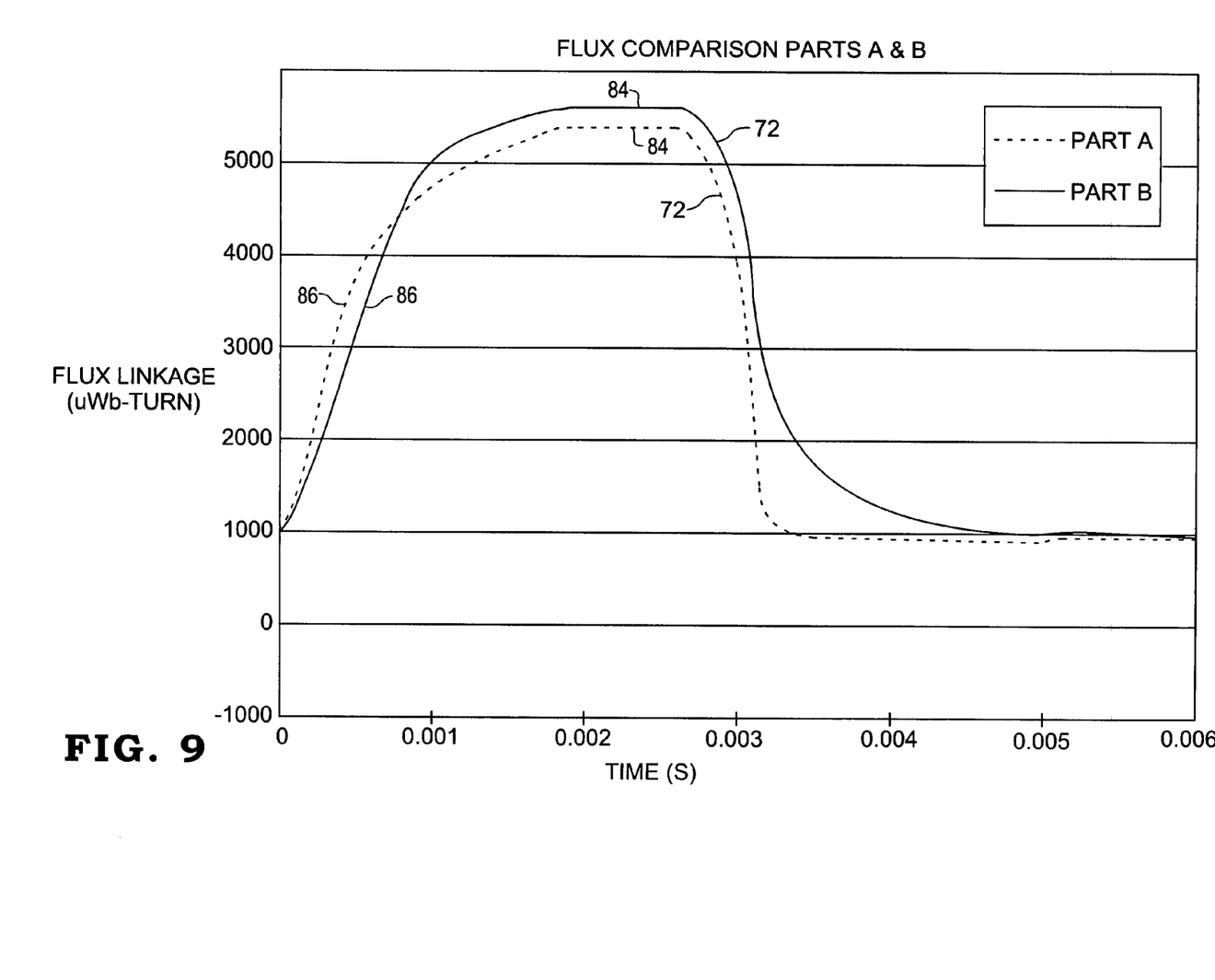
FIG. 9 is a combination graph showing flux linkage vs. time of the first and second magnetic components evaluated with the disclosed method using the disclosed device.

In the flux versus time graph, the magnitude of the maximum flux 84 during the transient signal is a measure of the saturation flux density of the magnetic component, and therefore is a measure of the magnetic force generated by the magnetic component. The rise rate of the transient flux signal (approximated by the slope of a line tangent to the rising portion 86 of the flux versus time curve) is a measure of the rise in magnetic force generated by the magnetic component.

Figure 10:
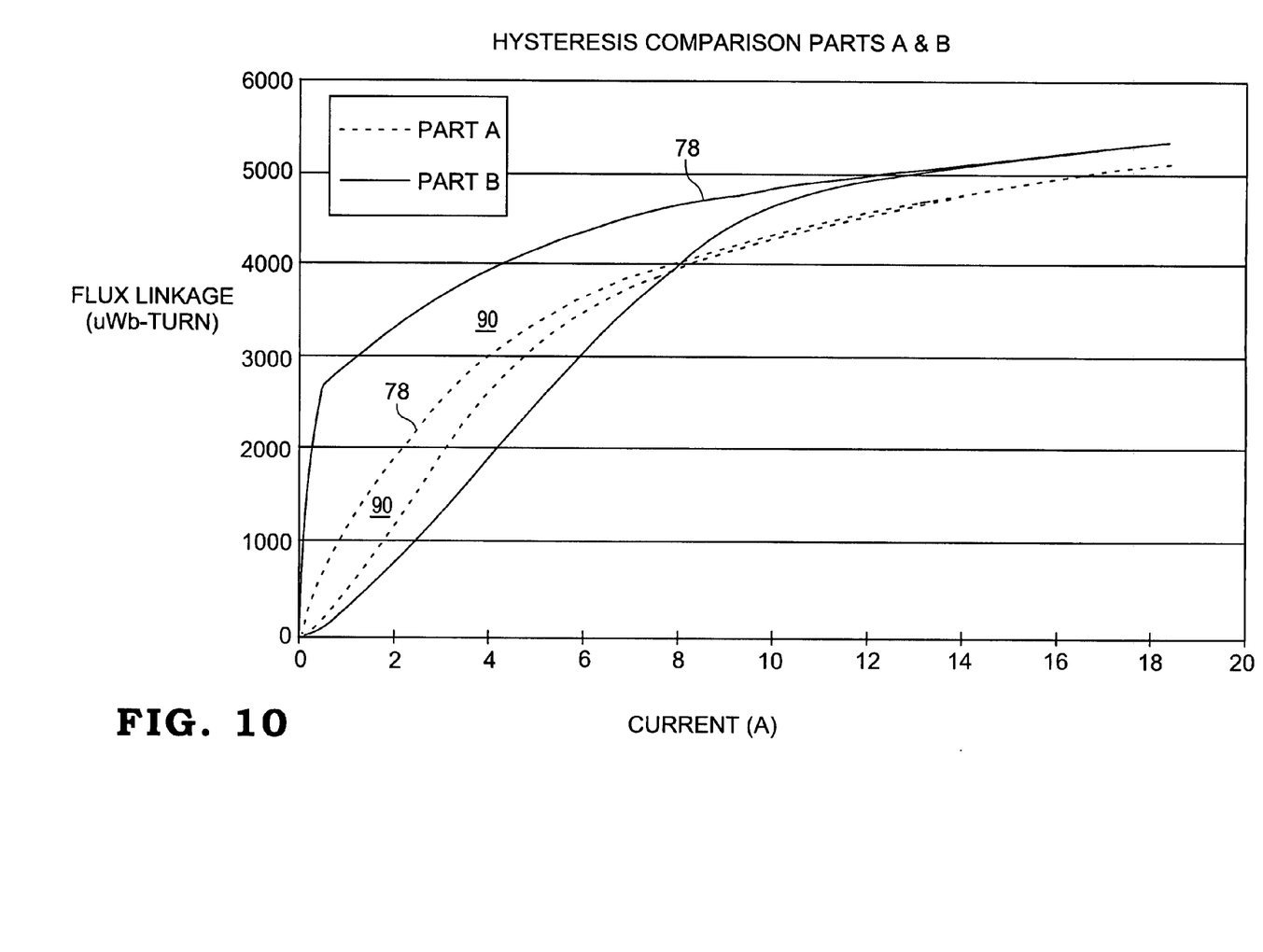
FIG. 10 is a combination hysteresis graph showing the flux linkage vs. current performance of the first and second magnetic components evaluated with the disclosed method using the disclosed device.

As shown, for example, in FIG. 10, hysteresis measurements can also be taken, wherein the area 90 within the hysteresis loop is a measurement of the energy dissipated by the magnetic part and the closure device.

Flux Φ(t) is calculated by the formula:

$$\varphi(t) = \int \frac{(V - iR)}{N} dt,$$

where R is the electrical resistance of the coil and N is the number of turns in the coil. Typically, the resistance of the coil is assumed to be a known fixed value. However, the dependency of resistance upon temperature (both ambient and coil temperature which increases with current flow) is well documented. Other factors may also affect the resistance of the coil. Therefore, to obtain a more accurate value of the coil resistance, measurements are taken from which the effective resistance of the coil is calculated. In a preferred embodiment, a transient current signal is applied to the coil, producing a transient voltage across the terminals (60) of the coil and a transient magnetic flux.

Sufficient time is allowed to pass since the most recent excitation of the coil so that at the beginning of the transient signal ($t_0$) the voltage, current and flux are all zero. After the transient, the voltage and current are both zero. Transient components of the flux should also be zero once sufficient time has passed since the end of the transient signal, i.e. at $t_f$. If the assumed known fixed value of resistance (R) is slightly off, or the current or voltage measurement is not accurate, the formula yields a non-zero value of the flux after the transient is complete. The disclosed device 20 and method compensates for these measurement inaccuracies to zero the transient flux after the transient by calculating an effective resistance $R_{eff}$ for the coil based on readings taken during the excitation of the coil. The initial excitation occurs over a time span from $t_0$ to $t_f$. At $t_0$ and at $t_f$, the current and voltage are zero. Between $t_0$ and $t_f$ a transient voltage signal is injected to excite the coil. The effective resistance of the coil can then be determined by the equation:

$$R_{eff} = \frac{\int_{t_0}^{t_f} v\, dt}{\int_{t_0}^{t_f} i\, dt}.$$

$R_{eff}$ is used in evaluation of the magnetic performance to obtain a time dependent trace of flux that yields both energy storage and hysteresis and eddy current loss information. The flux is calculated using the equation:

$$\varphi(t) = \int \frac{(V - iR_{eff})}{N} dt.$$

This information is used to monitor performance of magnetic component 22.

Flux can be monitored independently by incorporating a separate flux monitoring coil 80 into device 20. Flux in monitoring coil 80 is measured by monitoring voltage across the independent flux coil leads 82 and calculating flux via:

$$\varphi_m(t) = \int \frac{V}{N_{fc}} dt,$$

where $N_{fc}$ is the number of turns on the independent flux monitoring coil 80 and $\Phi_m(t)$ is the monitored flux. In the illustrated embodiment, flux monitoring coil 80 includes a single turn. In a non-illustrated alternative embodiment, flux monitoring coil 80 includes two turns. In general, flux monitoring coil 80 will include a much smaller number of turns than excitation coil. The monitored flux $\Phi_m(t)$ can be compared to the calculated flux Φ(t) to ensure that the wave forms are the same shape. Generally, the amplitudes will differ because of flux leakage in the magnetic part and other factors.

Those skilled in the art will recognize that evaluation of performance will be accomplished by comparison with accepted standards so as to fall within an envelope of performance parameters.

While the invention has been illustrated and described in detail in the foregoing drawings and description, the same is to be considered as illustrative and not restrictive in character, it being understood that only preferred embodiments thereof have been shown and described and that all changes and modifications that come within the spirit of the invention are desired to be protected.

We claim:

1. A device for measuring transient magnetic performance of a magnetic component, the device comprising
   a flux path closure device coupled to the magnetic component to define a closed flux path through the flux path closure device and the magnetic component,
   an excitation coil responsive to a transient excitation signal to generate a transient magnetic flux in the closed flux path, and
   a monitoring device configured to monitor a transient voltage across, and a transient current through, the excitation coil resulting from application of the transient excitation signal thereto, the monitoring device configured to compute an effective resistance of the excitation coil as a function of the transient voltage and the transient current, and to compute the transient magnetic flux as a function of the transient voltage, the transient current and the effective resistance.

2. The device of claim 1 wherein the monitoring device is configured to compute an integrated voltage as an integral of a number of transient voltage values measured across the excitation coil over a duration of the transient excitation signal and to compute an integrated current as an integral of a number of transient current values measured through the excitation coil over the duration of the transient excitation signal,
   and wherein the monitoring device is configured to compute the effective resistance of the excitation coil as a ratio of the integrated voltage and the integrated current.

3. The device of claim 1 wherein the monitoring device is configured to compute the transient magnetic flux as a function of the transient voltage, the transient current and a number of turns in the excitation coil.

4. The device of claim 3 wherein the monitoring device is configured to compute the transient magnetic flux as a ratio of an integral of a function over time and the number of turns of the excitation coil, the function being a difference between the transient voltage and a product of the transient current and the effective resistance of the excitation coil.

5. The device of claim 1 wherein the magnetic component defines a cavity therein sized to receive the excitation coil therein.

6. The device of claim 1 wherein the flux path closure device defines a cavity therein sized to receive the excitation coil therein.

7. The device of claim 1 wherein the flux path closure device is fabricated from a material that suppresses eddy current therein.

8. The device of claim 7 wherein the flux path closure device is fabricated from oxide-coated, pressed metal particles.

9. The device of claim 8 wherein the metal particles are iron particles.

10. The device of claim 7 wherein the flux path closure device is fabricated from laminated layers of iron.

11. The device of claim 1 further including a spacer positioned between the flux path closure device and the magnetic component with the closed flux path extending therethrough.

12. The device of claim 11 wherein the spacer is formed of a non-magnetic material.

13. The device of claim 11 wherein the spacer is formed of an electrically non-conductive material.

14. The device of claim 1 further including a signal source configured to produce the transient excitation signal.

15. The device of claim 14 wherein the signal source is a current source, and wherein the transient excitation signal is a transient current signal.

16. The device of claim 14 wherein the signal source is a voltage source, and wherein the transient excitation signal is a transient voltage signal.

17. The device of claim 1 wherein the monitoring device includes means for monitoring the transient voltage across the excitation coil.

18. The device of claim 1 wherein the monitoring device includes means for monitoring the transient current through the excitation coil.

19. The device of claim 1 further including a graphing system configured to plot the transient magnetic flux as flux linkage vs. time.

20. The device of claim 1 further including a graphing system configured to plot the transient magnetic flux as flux linkage vs. current.

21. The device of claim 1 further including a flux coil separate from the excitation coil,
   wherein the monitoring device is configured to monitor a voltage across the flux coil and compute the transient magnetic flux as a function of the voltage across the flux coil and a number of turns in the flux coil.

* * * * *